United States Patent
Itou

[11] Patent Number: 5,986,959
[45] Date of Patent: Nov. 16, 1999

[54] SEMICONDUCTOR MEMORY DEVICE HAVING INTERNAL VOLTAGE DOWN-CONVERTING CIRCUIT REDUCING CURRENT CONSUMPTION UPON POWER ON

[75] Inventor: Takashi Itou, Hyogo, Japan

[73] Assignee: Mitsubishi Denki Kabushiki Kaisha, Tokyo, Japan

[21] Appl. No.: 08/899,815

[22] Filed: Jul. 24, 1997

[30] Foreign Application Priority Data

Feb. 14, 1997 [JP] Japan .................................. 9-030093

[51] Int. Cl.$^6$ ................................ G11C 13/00
[52] U.S. Cl. .................. 365/226; 365/194; 365/196; 365/210
[58] Field of Search .................... 365/226, 194, 365/210, 196

[56] References Cited

U.S. PATENT DOCUMENTS 5,612,920  3/1997  Tomishima .................. 365/189.09 X

FOREIGN PATENT DOCUMENTS 195 21 730
   A1   1/1996   Germany .
64-27094   1/1989   Japan .
3-272088  12/1991   Japan .

*Primary Examiner*—Do Hyun Yoo
*Attorney, Agent, or Firm*—McDermott, Will & Emery

[57] ABSTRACT

In order to reduce current consumption immediately after a power-on, generation of a voltage down-converting activation signal for activating a voltage down-converting circuit in accordance with an external control signal is stopped for maintaining the voltage down-converting activation signal supplied to the voltage down-converting circuit in an inactivate state. The voltage down-converting circuit can be maintained in the inactive state for a period from a power-on up to a dummy cycle, for reducing current consumption.

7 Claims, 7 Drawing Sheets

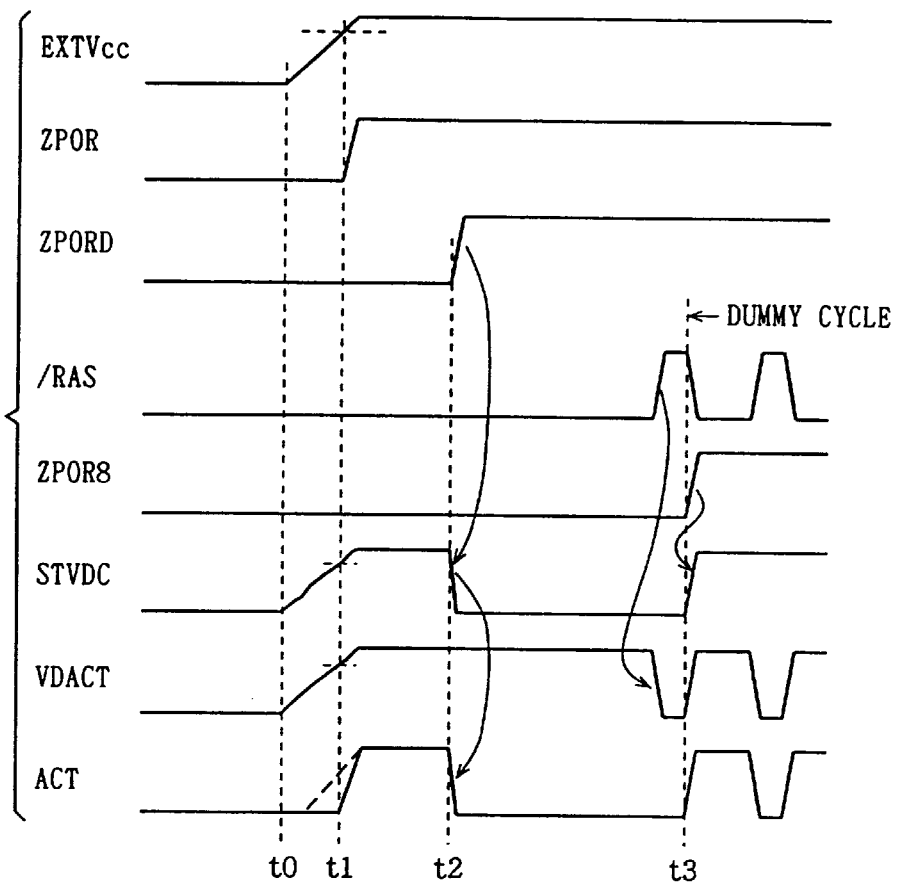
FIG. 9
FIG. 10 PRIOR ART
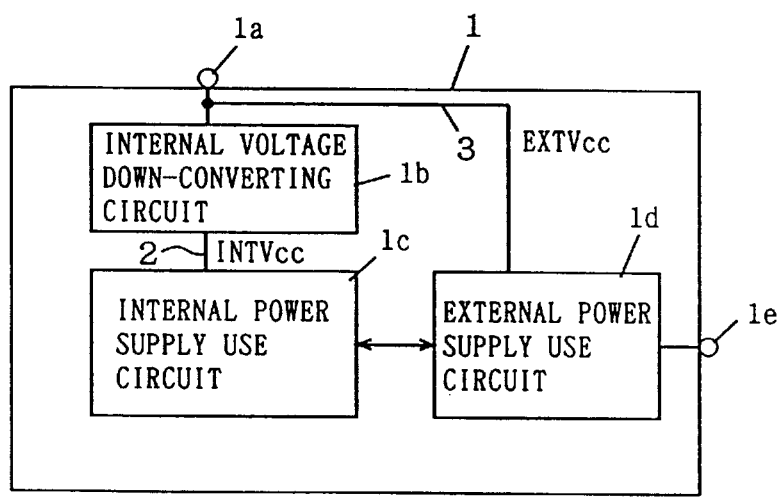

SEMICONDUCTOR MEMORY DEVICE HAVING INTERNAL VOLTAGE DOWN-CONVERTING CIRCUIT REDUCING CURRENT CONSUMPTION UPON POWER ON

BACKGROUND OF THE INVENTION

1. Field of the Invention

The present invention relates to a semiconductor memory device, and more particularly, it relates to a semiconductor memory device having an internal power supply voltage down-converting circuit for converting down an external power supply voltage to produce an internal power supply voltage. More specifically, the present invention relates to a structure for reducing current consumption in an internal power supply voltage down-converting circuit upon a power-on.

2. Description of the Background Art

As a semiconductor memory device is increased in storage capacity and implemented with higher density and integration, transistor elements forming the same are refined or miniaturized. In order to guarantee the reliability of such refined transistor elements and reducing power consumption, an operating power supply voltage is preferably reduced. Such reduction of the operating power supply voltage guarantees the reliability of gate insulating films of MOS transistors (insulated gate field effect transistors) forming the semiconductor memory device while reducing power which is proportionate to the square of the operating power supply voltage V.

However, the semiconductor memory device must keep compatibility with those of earlier generations, and hence an external power supply voltage which is a system power source voltage for example is down-converted to a voltage level required in the interior.

FIG. 10 schematically illustrates the overall structure of a conventional semiconductor memory device. Referring to FIG. 10, the semiconductor memory device 1 includes an internal voltage down-converting circuit 1b which is connected with a power supply terminal 1a receiving an external power supply voltage EXTVcc for down-converting the same and generating an internal power supply voltage INTVcc on an internal power supply line 2, an internal power supply use circuit 1c using the internal power supply voltage INTVcc on the internal power supply line 2 for executing a prescribed function, and an external power supply use circuit id using the external power supply voltage EXTVcc on an external power supply line 3 which is connected with the external power supply terminal 1a. The external power supply use circuit id is connected with an external terminal 1e, for transmitting/receiving signals/data to/from an external circuit of the semiconductor memory device 1.

The internal power supply use circuit 1c uses the internal power supply voltage INTVcc on the internal power supply line 2 as one operating power supply voltage, for performing prescribed processing. This internal power supply use circuit 1c transmits/receives signals to/from the exterior of the device 1 through the external power supply use circuit 1d serving as an interface.

FIG. 11 illustrates an exemplary structure of the internal voltage down-converting circuit 1b shown in FIG. 10. Referring to FIG. 11, the internal voltage down-converting circuit 1b includes a comparator 10a for comparing a reference voltage Vref from a reference voltage generator circuit (not shown) with the internal power supply voltage INTVcc on the internal power supply line 2 when activated, a current source transistor 10b for activating the comparator 10a in response to activation of a voltage down-converting activation signal ACT, a drive transistor 10c formed by a p-channel MOS transistor which is connected between the external power supply terminal 1a and the internal power supply line 2 and receives an output signal of the comparator 10a at its gate, and a precharge transistor 10d formed by a p-channel MOS transistor for holding a gate potential of the drive transistor 10c at the level of the external power supply voltage EXTVcc in response to inactivation of the voltage down-converting activation signal ACT. The voltage down-converting activation signal ACT, the generation mode of which is described later, is brought into an active state of the external power supply voltage EXTVcc level during an activation period when the internal power supply use circuit 1c is brought into an operating state. The operation of the internal voltage down-converting circuit 1b shown in FIG. 11 is now briefly described.

When the voltage down-converting activation signal ACT is at a low level of an inactive state, the current source transistor 10b is in a nonconducting state, and the comparator 10a is in an inactive state. On the other hand, the precharge transistor 10d conducts in response to the inactive voltage down-converting activation signal ACT, to precharge the gate potential of the drive transistor 10c to the external power supply voltage EXTVcc level. The drive transistor 10c, whose gate and source potentials are identical to each other, is maintained in a nonconducting state. While the voltage down-converting activation signal ACT is in an inactive state, therefore, the internal voltage down-converting circuit 1b is in an inactive state to stop the operation of generating the internal power supply voltage INTVcc.

When the voltage down-converting activation signal ACT goes high to enter an active state, the current source transistor 10b conducts to form a current path for the comparator 10a, thereby activating the comparator 10a. The comparator 10a is formed by a differential amplifier circuit for differentially amplifying the internal power supply voltage INTVcc on the internal power supply line 2 and the reference voltage Vref (this structure is described later in detail). When the internal power supply voltage INTVcc is higher than the reference voltage Vref, the output signal of the comparator 10a goes high and the drive transistor 10c enters a nonconducting state. When the internal power supply voltage INTVcc is lower than the reference voltage Vref, on the other hand, the output signal level of the comparator 10a is reduced and the conductance of the drive transistor 10c is increased. The drive transistor 10c supplies a current from the external power supply terminal 1a to the internal power supply line 2 in accordance with its conductance, to increase the internal power supply voltage INTVcc.

The voltage down-converting activation signal ACT enters an active state when the internal power supply use circuit 1c using the internal power supply voltage INTVcc on the internal power supply line 2 operates. In this state, there is such a possibility that a large amount of operating current flows to the internal power supply use circuit 1c to reduce the internal power supply voltage INTVcc. In order to compensate for such reduction of the internal power supply voltage INTVcc in operation of the internal power supply use circuit 1c, the internal voltage down-converting circuit 1b is activated in accordance with the voltage down-converting activation signal ACT. In a non-operating state (standby state) of the internal power supply use circuit 1c, the internal power supply voltage INTVcc is not used but only an extremely small standby current (leakage current) is generated, and the internal power supply voltage Vcc is maintained at a substantially constant voltage level.

FIG. 12 illustrates an exemplary structure of the comparator 10a shown in FIG. 11. Referring to FIG. 12, the comparator 10a includes p-channel MOS transistors 10aa and 10ab forming a current mirror circuit which is connected with a power supply node 3a and supplies a current from the power supply node 3a, and n-channel MOS transistors 10ac and 10ad forming a comparator stage for comparing the internal power supply voltage INTVcc with the reference voltage Vref. The gate and the drain of the p-channel MOS transistor 10aa are connected with the drain of the n-channel MOS transistor 10ac. The gate and the drain of the p-channel MOS transistor 10ab are connected with the gate of the p-channel MOS transistor 10aa and the drain of the n-channel MOS transistor 10ad, respectively. The sources of the MOS transistors 10ac and 10ad are connected with the drain of the current source transistor 10b in common.

The internal power supply voltage INTVcc and the reference voltage Vref are supplied to the gates of the MOS transistors 10ac and 10ad, respectively. The connection node (drain) between the MOS transistors 10ab and 10ad is connected with the gate of the drive transistor 10c. The operation of the comparator circuit (including the comparator 10a and the current source transistor 10b) shown in FIG. 12 is now described.

When the voltage down-converting activation circuit ACT is at a low level, the current source transistor 10b is in a nonconducting state. Therefore, a path for a current flowing from the power supply node 3a to a ground node is cut off, so that this comparator circuit consumes only a leakage current of several $\mu$A, for example, in this current source transistor 10b.

When the voltage down-converting activation signal ACT goes high, the current source transistor 10b conducts to form the path for feeding a current from the power supply node 3a to the ground node. When the internal power supply voltage INTVcc is higher than the reference voltage Vref, the conductance of the MOS transistor 10ac exceeds that of the MOS transistor 10ad, whereby the MOS transistor 10ac feeds a current in a larger quantity than the MOS transistor 10ad. The current flowing through the MOS transistor 10ac is supplied from the MOS transistor 10aa. The MOS transistors 10aa and 10ab form the current mirror circuit, and hence currents of the same quantity flow through the MOS transistors 10aa and 10ab (the MOS transistors 10aa and 10ab are identical in size to each other). The MOS transistor 10ad cannot entirely discharge the current supplied from the MOS transistor 10ab, and hence the gate potential of the drive transistor 10c is increased.

When the internal power supply voltage INTVcc is lower than the reference voltage Vref, on the other hand, the conductance of the MOS transistor 10ac is smaller than that of the MOS transistor 10ad, and hence the current flowing through the MOS transistor 10ac is smaller than that flowing in the MOS transistor 10ad. The current supplied through the MOS transistor 10ab is identical to that flowing through the MOS transistor 10ac, and hence the MOS transistor 10ad discharges the current supplied from the MOS transistor 10ab, the potential at the drain of the MOS transistor 10ad is reduced, and the conductance of the drive transistor 10c is increased in response.

This comparator circuit supplies a current to the internal power supply line 2 through the drive transistor 10c when the internal power supply use circuit 1c (see FIG. 10) uses the internal power supply voltage INTVcc, in order to compensate for reduction of the voltage level. A relatively large amount of operating current of several 10 mA, for example, flows in operation of the internal power supply use circuit 1c. In order to reliably compensate for reduction of the internal power supply voltage INTVcc caused by the large current consumption, the response speed of the comparator circuit is sufficiently increased. Therefore, a current of about several mA, for example, flows through the current source transistor 10b, to change the gate potential of the drive transistor 10c at a high speed in accordance with the difference between the internal power supply voltage INTVcc and the reference voltage Vref.

The internal voltage down-converting circuit 1b including the comparator circuit using the relatively large current is driven only at need, thereby reducing the current consumption.

FIG. 13 schematically illustrates the structure of a part generating the voltage down-converting activation signal ACT. Referring to FIG. 13, the voltage down-converting activation signal generator part includes an input buffer 15 receiving a row address strobe signal /RAS and a power-on detection signal ZPOR, and a voltage down-converting activation signal generator circuit 16 generating the voltage down-converting activation signal ACT in accordance with an output signal of the input buffer 15. The input buffer 15 includes a gate circuit 15a outputting a low-level signal when the row address strobe signal /RAS is at a low level and the power-on detection signal ZPOR is at a high level. The voltage down-converting activation signal generator circuit 16 includes an invertor 16b inverting the output signal of the gate circuit 15a.

The row address strobe signal /RAS defines the memory cycle of the semiconductor memory device 1, which is a DRAM (dynamic random access memory). When the row address strobe signal /RAS enters an active state of a low level, the DRAM uses the internal power supply voltage INTVcc in its interior, to start a memory cell selecting operation. The power-on detection signal ZPOR enters an active state of a high level when the external power supply voltage EXTVcc is applied and reaches a prescribed voltage level or enters a stable state. The power-on detection signal ZPOR is employed for inhibiting the internal circuit from operating when the external power supply voltage EXTVcc is at an instable voltage level. The operations of the voltage down-converting activation signal generator part shown in FIG. 13 are now described with reference to waveform diagrams shown in FIGS. 14 and 15.

With reference to FIG. 14, description is now made on an operation in case of starting to supply the external power supply voltage EXTVcc to the semiconductor memory device 1 while setting the row address strobe signal /RAS at a high level. Power is on at a time t1, to increase the voltage level of the external power supply voltage EXTVcc. An internal node of the comparator circuit is charged in response to the application of the power supply voltage EXTVcc, whereby a relatively large peak current is generated in the comparator circuit in accordance with the power-on. Referring to FIG. 14, a reference symbol 1c denotes the current flowing in the comparator circuit. After the internal node is charged to a prescribed level, the MOS transistors forming the semiconductor memory device 1 are maintained in prescribed states (initial states) respectively, and the potential of the internal node is increased in accordance with the increase of the external power supply voltage EXTVcc. In this state, the comparator circuit is in a stable state (initial state), and the current 1c of the comparator circuit is stable at a small value (the signal ACT is at a low level).

When the external power supply voltage EXTVcc reaches a prescribed voltage level at a time t2 to reduce the possibility of causing a malfunction of the internal circuit, the power-on detection signal ZPOR rises to a high level. Despite this rise of the power-on detection signal ZPOR, the row address strobe signal /RAS applied to the gate circuit 15a and the output signal of the gate circuit 15a are at high levels, and hence the voltage down-converting activation signal ACT outputted from the invertor 16b is at a low level. Therefore, the internal voltage down-converting circuit 1b maintains its inactive state, not to increase the current consumption.

At a time t3, the row address strobe signal /RAS falls to a low level in order to carry out a dummy cycle described later. In response to the fall of the row address strobe signal /RAS, the output signal from the gate circuit 15a falls to a low level, and the voltage down-converting activation signal ACT outputted from the invertor 16b goes high in response. In response thereto, the internal voltage down-converting circuit 1b is activated, so that the comparator circuit performs a compare operation. The current source transistor 10b of the comparator circuit conducts in accordance with the activation of the voltage down-converting activation signal ACT, whereby a relatively large current 1c flows in the comparator circuit.

When the external power supply voltage EXTVcc is applied while setting the row address strobe signal /RAS at H level, the voltage down-converting activation signal ACT is maintained at a low level and current consumption in the internal voltage down-converting circuit 1b is at a substantially ignorable degree in the power supply (leakage current level), as shown in FIG. 14.

With reference to FIG. 15, description is now made on an operation in case of supplying power while setting the row address strobe signal /RAS at a low level. The power is on at a time t1 while setting the row address strobe signal /RAS at a low level, to increase the voltage level of the external power supply voltage EXTVcc. Also in this case, the current 1c is instantaneously increased in order to set the internal node of the internal voltage down-converting circuit 1b in an initial state similarly to the case shown in FIG. 14, and thereafter returns to a normal state. Despite the low level of the row address strobe signal /RAS, the power-on detection signal ZPOR is at a low level, the output signal of the gate circuit 15a is at a high level, and the voltage down-converting activation signal ACT is at a low level in response.

When the power supply voltage EXTVcc reaches a prescribed voltage level at a time t2 and is determined to reach a voltage level for driving the internal circuit with no malfunction, the power-on detection signal ZPOR rises to a high level. Due to this rise of the power-on supply detection signal ZPOR, the output signal of the gate circuit 15a falls to a low level and the voltage down-converting activation signal ACT enters an active state of a high level. The internal voltage down-converting circuit 1b is activated in response, so that the comparator circuit performs a compare operation. Thus, the current 1c of the comparator circuit reaches a high value similar to that in a normal operation. When the power is applied while bringing the row address strobe signal /RAS into a low level and setting the DRAM in an active state, the internal voltage down-converting circuit 1b is activated in response to activation of the power-on detection signal ZPOR, to disadvantageously consume a large amount of current to increase the power consumption after the power-on.

SUMMARY OF THE INVENTION

An object of the present invention is to provide a semiconductor memory device which can reliably reduce current consumption in its internal voltage down-converting circuit immediately after a power-on.

Another object of the present invention is to provide a semiconductor memory device which can reduce current consumption in an internal voltage down-converting circuit immediately after a power-on regardless of the logical level of a row address strobe signal serving as a memory cycle defining signal.

The semiconductor memory device according to the present invention includes an internal voltage down-converting circuit which is activated in response to activation of a voltage down-converting activation signal for down-converting an external power supply voltage and generating an internal power supply voltage, a power-on detection circuit for generating a power-on detection signal entering an active state in response to application of the external power supply voltage, and control circuitry for maintaining the voltage down-converting activation signal in an inactive state in response to activation of the power-on detection signal.

The voltage down-converting activation signal is maintained in an inactive state after the power-on, whereby current consumption in the internal circuit can be suppressed by maintaining the internal voltage down-converting circuit in an inactive state.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a signal waveform diagram representing another operation of the circuit shown in FIG. 7;

FIG. 10 schematically illustrates the overall structure of a conventional semiconductor memory device;

DESCRIPTION OF THE PREFERRED EMBODIMENTS

[Embodiment 1]

Figure 1:
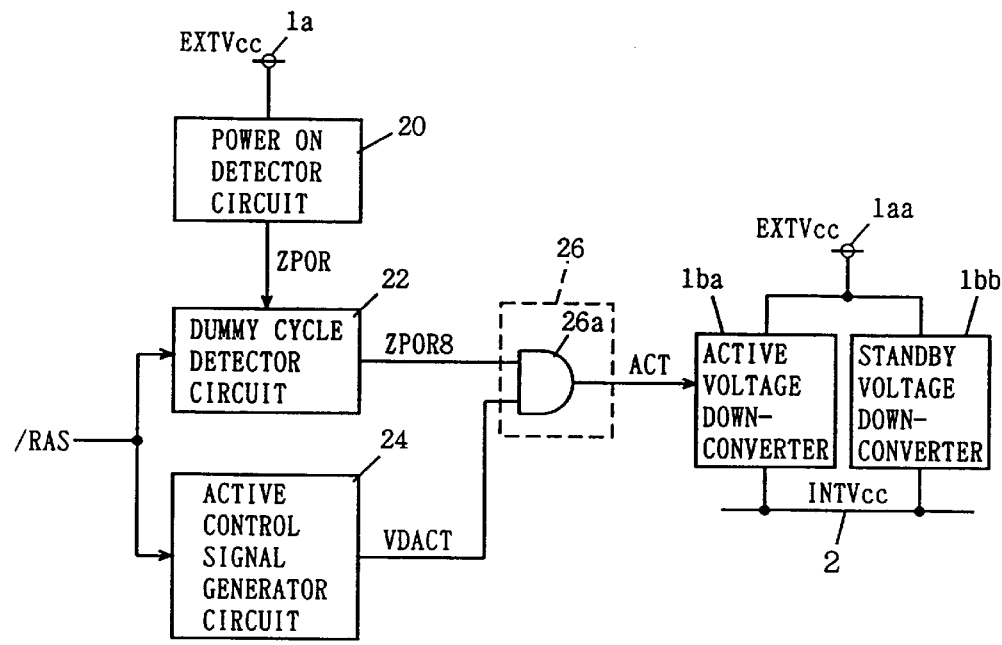
FIG. 1 is a block diagram schematically illustrating the structure of a principal part of a semiconductor memory device according to an embodiment 1 of the present invention.

FIG. 1 illustrates the structure of a principal part of a semiconductor memory device according to an embodiment 1 of the present invention. Referring to FIG. 1, an internal voltage down-converting circuit includes an active voltage down-converting circuit 1ba which is activated in activation of a voltage down-converting activation signal ACT for supplying a current from an external power supply node 1aa to an internal power supply line 2, and a standby voltage down-converting circuit 1bb which regularly operates to supply a current from the external power supply node 1aa to the internal power supply line 2. The current drivability of the standby voltage down-converting circuit 1bb is sufficiently reduced, to maintain the voltage level of an internal power supply voltage INTVcc in a standby state of the semiconductor memory device. The active voltage down-converting circuit 1ba is activated in activation of the voltage down-converting activation signal ACT, to operate with high current drivability and compensate for reduction of the internal power supply voltage INTVcc caused by a large operating current in operation of an internal power supply use circuit.

Figure 11:
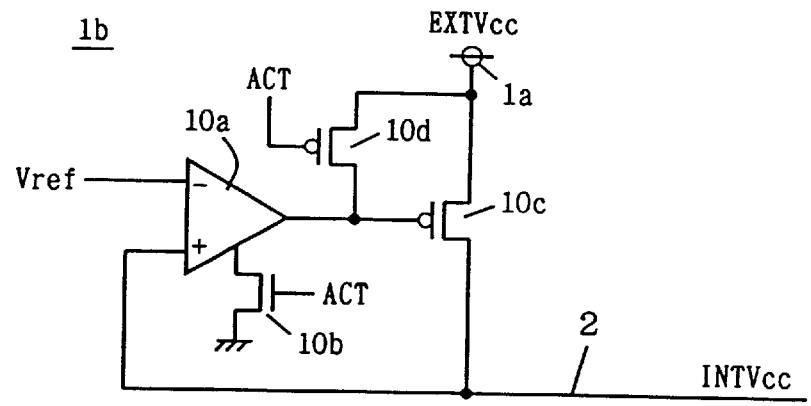
FIG. 11 schematically illustrates the structure of an internal voltage down-converting circuit shown in FIG. 10.
Figure 12:
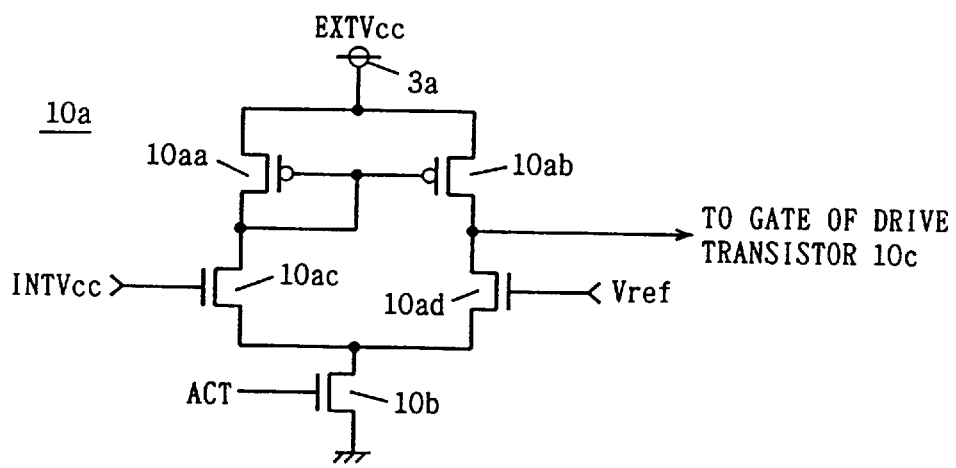
FIG. 12 illustrates an exemplary structure of a comparator circuit shown in FIG. 11.
Figure 13:
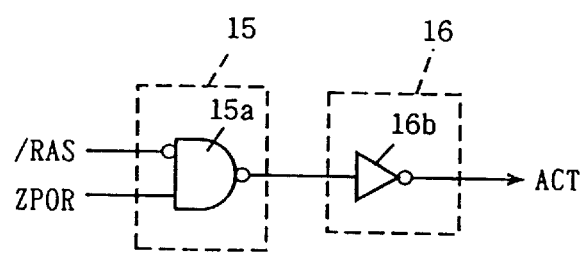
FIG. 13 illustrates an exemplary structure of a voltage down-converting activation signal generator part shown in FIGS. 11 and 12.
Figure 14:
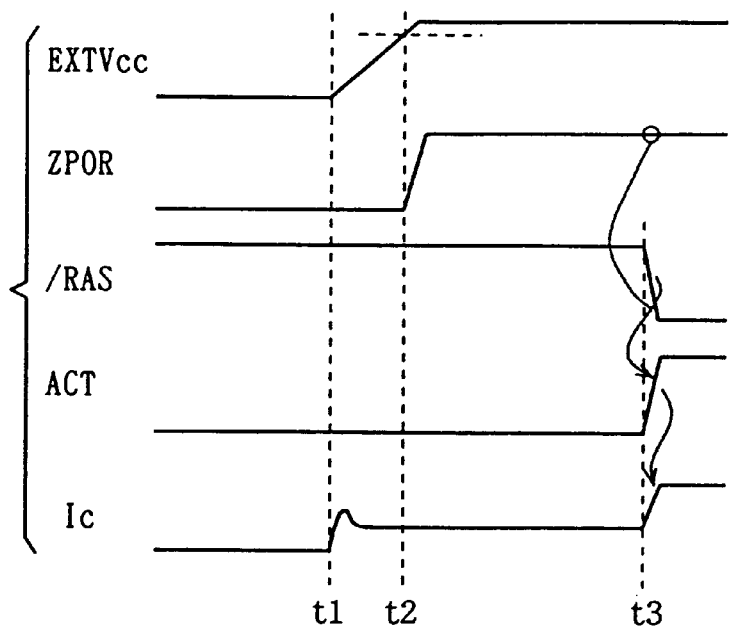
FIG. 14 is an operation waveform diagram of the circuit shown in FIG. 13.
Figure 15:
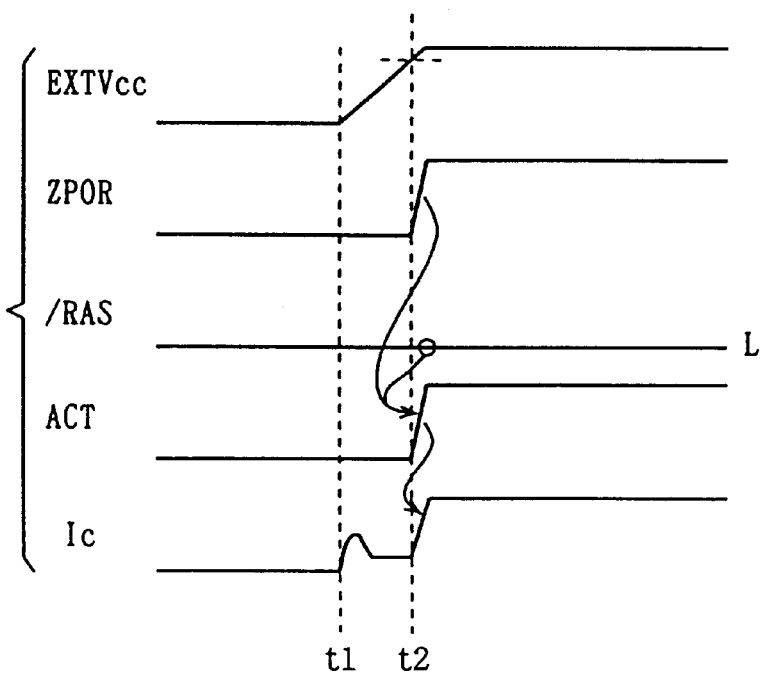
FIG. 15 is a signal waveform diagram representing an operation of the circuit shown in FIG. 13.

The active voltage down-converting circuit 1ba, which is identical in structure to that shown in FIGS. 11 and 12, includes a comparator which is activated in activation of the voltage down-converting activation signal ACT for comparing the internal power supply voltage IntVcc with a reference voltage Vref, a current drive transistor for supplying a current from the external power supply node 1aa to the internal power supply line 2 in accordance with an output signal of the comparator, and a transistor which conducts in inactivation of the voltage down-converting activation signal ACT for transmitting an external power supply voltage EXTVcc to the gate of the current drive transistor and bringing the current drive transistor into a nonconducting state. The standby voltage down-converting circuit 1bb includes a comparator which regularly operates to compare the internal power supply voltage IntVcc with the reference voltage Vref, and a current drive transistor for supplying a current from the external power supply node 1aa to the internal power supply line 2 in accordance with an output signal of this comparator. This structure is equivalent to the structure shown in FIG. 11 with regular operation of the current source transistor 10b and no provision of the precharge transistor 10d.

The semiconductor memory device further includes a power-on detector circuit 20 which is connected with the external power supply terminal 1a for detecting a power-on to the semiconductor memory device, a dummy cycle detector circuit 22 which is reset in response to activation of a power-on detection signal ZPOR from the power-on detector circuit 20 for detecting instruction of a dummy cycle in accordance with an externally applied row address strobe signal /RAS, an active control signal generator circuit 24 outputting an active control signal VDACT for activating the active voltage down-converting circuit 1ba in accordance with the external row address strobe signal /RAS, and a control circuit 26 receiving a dummy cycle detection signal ZPOR8 and the active control signal VDACT and outputting the voltage down-converting activation signal ACT.

When the external power supply voltage EXTVcc supplied to the power supply terminal 1a attains a constant voltage level or stable state, the power supply detector circuit 20 brings the power-on detection signal ZPOR into a high level of an active state.

The dummy cycle detection circuit 22 is activated (initialized) in response to the activation of the power-on detection signal ZPOR from the power-on detector circuit 20, for detecting instruction of the dummy cycle in accordance with activation of the row address strobe signal /RAS and driving the dummy cycle detection signal ZPOR8 to an active state of a high level when detecting the instruction of the dummy cycle.

The active control signal generator circuit 24 drives the active control signal VDACT to an active state in synchronization with the row address strobe signal /RAS. The control circuit 26 includes an AND circuit 26a receiving the dummy cycle detection signal ZPOR8 and the active control signal VDACT. Therefore, the voltage down-converting activation signal ACT applied to the active voltage down-converting circuit 1ba is maintained in an inactive state after the power-on until activation of the dummy cycle detection signal ZPOR8, regardless of the state of the active control signal VDACT. The operations of the circuit shown in FIG. 1 are now described with reference to waveform diagrams shown in FIGS. 2 and 3.

Figure 2:
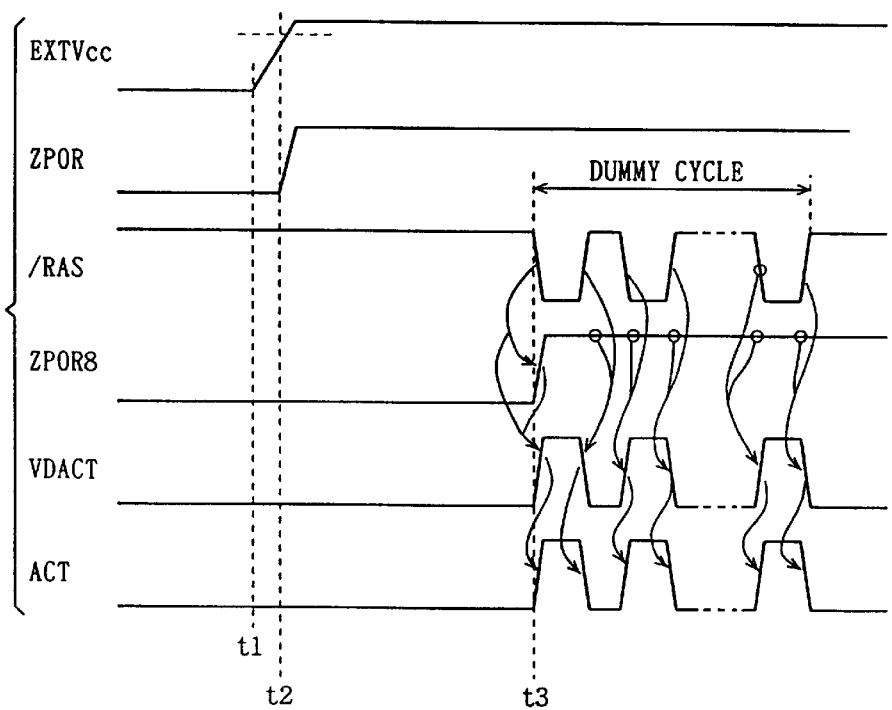
FIG. 2 is a signal waveform diagram representing an operation of the circuit shown in FIG. 1.

With reference to FIG. 2, description is first made on an operation in case of starting the supplying of power while setting the row address strobe signal /RAS at a high level.

At a time t1, the power is on to increase the voltage level of the external power supply voltage EXTVcc. When the external power supply voltage EXTVcc reaches a prescribed voltage level or a stable state, the power-on detection signal ZPOR from the power-on detector circuit 20 enters an active state of a high level at a time t2. The row address strobe signal /RAS is maintained at a high level, whereby both of the dummy cycle detection signal ZPOR8 from the dummy cycle detector circuit 22 and the active control signal VDACT from the active control signal generator circuit 24 are at low levels. Therefore, the voltage down-converting activation signal ACT from the control circuit 26 is at a low level, and the active voltage down-converting circuit 1ba maintains an inactive state. The standby voltage down-converting circuit 1bb operates in response to the power-on, for supplying a current to the power supply line 2 and increasing the internal power supply voltage INTVcc to a prescribed voltage level. An internal circuit (internal and external power supply use circuits) drives an internal node to an initial state, or a standby state in accordance with the increase of the internal and external power supply voltages INTVcc and EXTVcc, since the row address strobe signal /RAS is at a high level. A current consumed at this time is entirely supplied from the standby voltage down-converting circuit 1bb.

In order to reliably set the internal circuit in the initial standby state, the dummy cycle is executed. In this dummy cycle, the row address strobe signal /RAS is toggled eight times, for example, to operate circuits related to the row address strobe signal /RAS in the interior. In a DRAM, row selection and precharging of internal signal lines are performed in accordance with activation/inactivation of the row address strobe signal /RAS. Therefore, the respective signal lines and the internal node of the internal circuit can be reliably precharged at voltage levels in the standby state by carrying out the dummy cycles.

Referring to FIG. 2, the row address strobe signal /RAS falls from the high level to a low level at a time t3, to start the dummy cycle. In accordance with this start of the dummy cycle, the dummy cycle detection signal ZPOR8 from the dummy cycle detector circuit 22 enters an active state of a high level, and the control circuit 26 changes the voltage down-converting activation signal ACT in accordance with the active control signal VDACT from the active control signal generator circuit 24.

The active control signal VDACT is synchronous with the row address strobe signal /RAS. In this dummy cycle, therefore, the active control signal VDACT enters an active/inactive state in accordance with activation/inactivation of the row address strobe signal /RAS, and the voltage down-converting activation signal ACT enters an active/inactive state in response. Thus, the active voltage down-converting circuit 1ba is activated/inactivated in accordance with the voltage down-converting activation signal ACT, to compensate for reduction of the voltage level of the internal power supply voltage INTVcc caused by a large operating current in an internal circuit operation in the dummy cycle. Thus, the internal signal lines and the internal node are prevented from being precharged to erroneous potential levels by a malfunction of the internal circuit resulting from reduction of the internal power supply voltage INTVcc in the dummy cycle.

The voltage down-converting activation signal ACT is reliably maintained in the inactive state until a time t3 when the dummy cycle is instructed. Therefore, the active voltage down-converting circuit 1ba can be inactivated during this period, for reducing current consumption in the active voltage down-converting circuit 1ba in the power-on.

Figure 3:
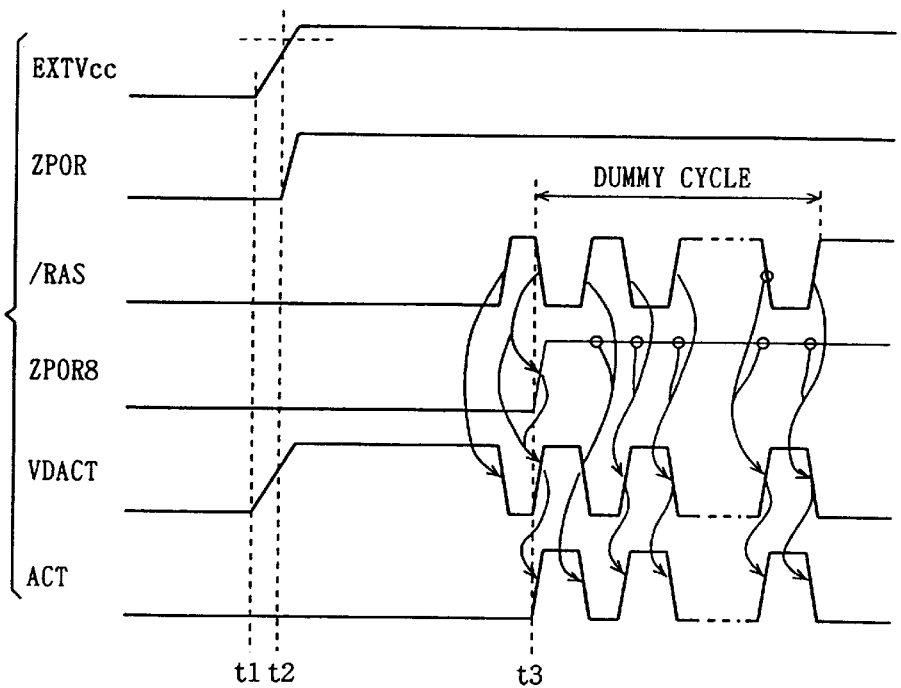
FIG. 3 is a signal waveform diagram representing another operation of the circuit shown in FIG. 1.

With reference to FIG. 3, description is now made on an operation in case of power-on while setting the row address strobe signal /RAS at a low level.

The power is on at a time t1, while setting the row address strobe signal /RAS at a low level. The voltage level of the external power supply voltage EXTVcc is increased in accordance with the power-on, whereby the voltage level of the active control signal VDACT from the active control signal generator circuit 24 is also increased. The external power supply voltage EXTVcc reaches a prescribed voltage level or enters a stable state at a time t2, whereby the power-on detection signal ZPOR goes high. The active control signal VDACT is also maintained at a high level. The dummy cycle detection signal ZPOR8 is in an inactive state of a low level, whereby the voltage down-converting activation signal ACT from the control circuit 26 maintains an inactive state of a low level, and the active voltage down-converting circuit 1ba also maintains an inactive state in response. The standby voltage down-converting circuit 1bb supplies a current from the external power supply node 1aa to the internal power supply line 2, to increase the internal power supply voltage INTVcc to a prescribed voltage level.

When the row address strobe signal /RAS is temporarily set at a high level in order to carry out the dummy cycle, the active control signal VDACT goes to a low level in response. The dummy cycle is started at the time t3, and the row address strobe signal /RAS is toggled between high and low levels a plurality of times (eight times). In response to fall of the row address strobe signal /RAS at the time t3, the dummy cycle detection signal ZPOR8 enters an active state of a high level, and the control circuit 26 changes the voltage down-converting activation signal ACT in accordance with the active control signal VACT. Thus, the active voltage down-converting circuit 1ba is activated in internal circuit operation (active state of the row address strobe signal /RAS) in the dummy cycle, to suppress reduction of the internal power supply voltage INTVcc caused by an operating current in the internal circuit operation.

Even if a memory controller is erroneously initialized in a start-up of a system power source, for example, and the power is initially supplied to the semiconductor memory device while setting the row address strobe signal /RAS at a low level, the voltage down-converting activation signal ACT is reliably maintained in an inactive state immediately after the power-on, so that the current consumption in the active voltage down-converting circuit 1ba can be reduced immediately after the power-on, as shown in FIG. 3.

Namely, the operation of the active voltage down-converting circuit 1ba can be reliably stopped to reduce its current consumption in the period from immediately after the power-on up to the start of the dummy cycle according to the embodiment 1 of the present invention, regardless of the logical level of the row address strobe signal /RAS.

Figure 4A:
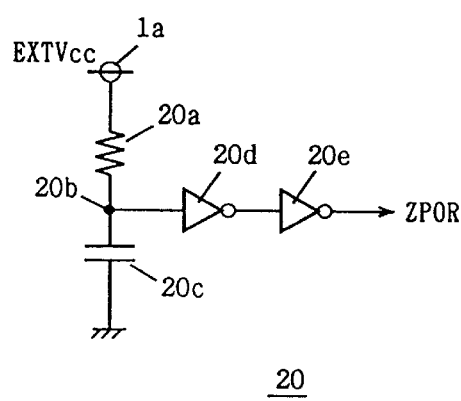
FIG. 4A illustrates an exemplary structure of a power-on detector circuit shown in FIG. 1.

FIG. 4A illustrates an exemplary structure of the power-on detector circuit 20 shown in FIG. 1. Referring to FIG. 4A, the power-on detector circuit 20 includes a resistive element 20a which is connected between the power supply node 1a and a node 20b, a capacitive element 20c which is connected between the node 20b and a ground node, an invertor 20d receiving a potential on the node 20b, and an invertor 20e receiving an output signal of the invertor 20d and outputting the power-on detection signal ZPOR. The invertors 20d and 20e are driven by the external power supply voltage EXTVcc serving as one operating power supply voltage. The operation of the power-on detector circuit 20 shown in FIG. 4A is now described with reference to FIG. 4B which is an operation waveform diagram thereof.

Power is on at a time t0, to increase the voltage level of the external power supply voltage EXTVcc of the power supply node 1a. Following the increase of the external power supply voltage EXTVcc, the capacitive element 20c is charged through the resistive element 20a, to slowly increase the potential level of the node 20b. The speed for increasing the potential of the node 20b is decided by the resistance value of the resistive element 20a and the capacitance value of the capacitive element 20c. While the potential of the node 20b is at a low level, an output signal of the invertor 20d goes high in accordance with the increase of the external power supply voltage EXTVcc, and the power-on detection signal ZPOR maintains a low level in response.

At a time t1, the potential level of the node 20b exceeds an input logic threshold value of the invertor 20d, whereby the output signal of the invertor 20d goes low and the power-on detection signal ZPOR from the invertor 20e rises to a high level. Thus, the external power supply voltage EXTVcc reaches a prescribed voltage level, whereby the power-on detection signal ZPOR is brought into an active state of a high level.

Figure 4B:
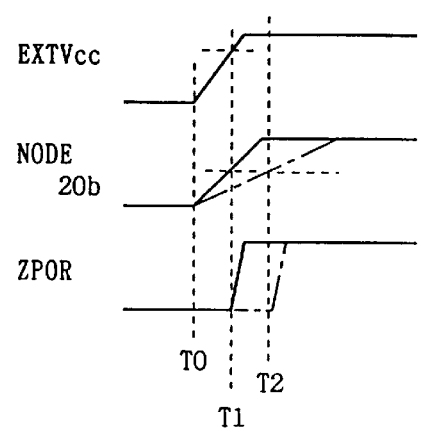
FIG. 4B illustrates its operation waveform.

When the resistance value of the resistive element 20a and the capacitance value of the capacitive element 20c are so high that the potential of the node 20b is increased at a slow speed as shown by one-dot chain line in FIG. 4B, the power-on detection signal ZPOR enters an active state of a high level at a time t2 when the external power supply voltage EXTVcc reaches the prescribed voltage level and enters a stable state at this voltage level. The power-on detection signal ZPOR may be activated at either time t1 or t2.

Figure 5:
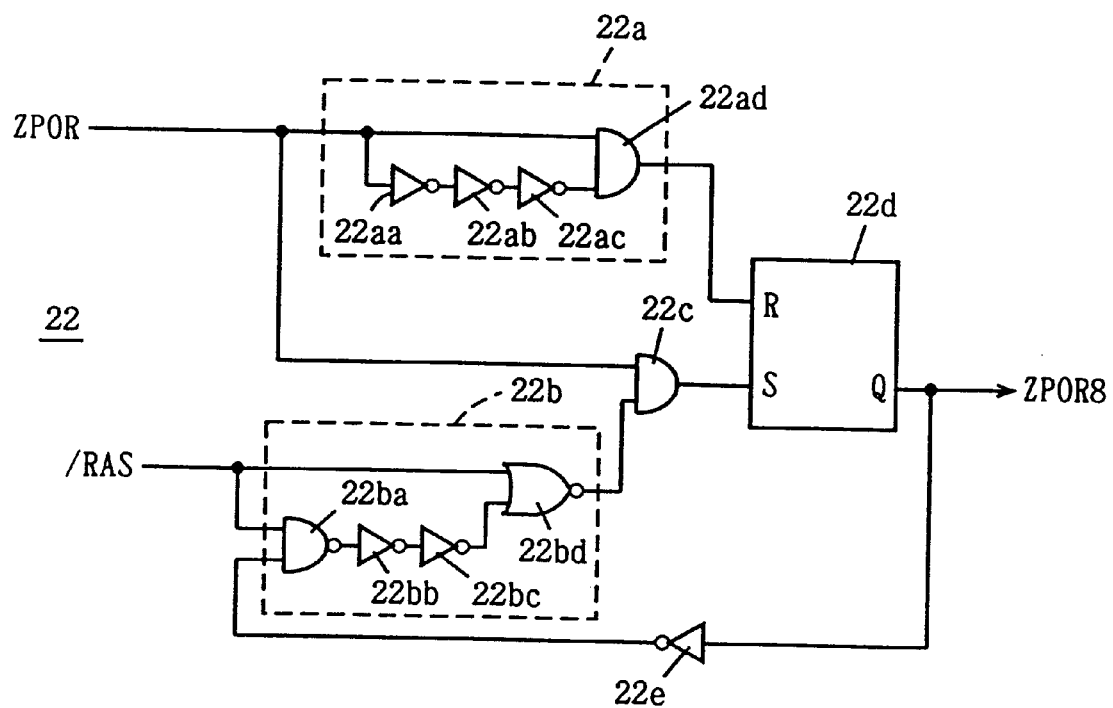
FIG. 5 illustrates an exemplary structure of a dummy cycle detector circuit shown in FIG. 1.

FIG. 5 illustrates an exemplary structure of the dummy cycle detector circuit 22 shown in FIG. 1. Referring to FIG. 5, the dummy cycle detector circuit 22 includes a one-shot pulse generator circuit 22a outputting a one-shot pulse signal having a prescribed time width in response to rise of the power-on detection signal ZPOR, a one-shot pulse generator circuit 22b which is activated in inactivation of the dummy cycle detection signal ZPOR8 for generating a one-shot pulse signal in response to fall of the row address strobe signal /RAS, an AND circuit 22c receiving the power-on detection signal ZPOR and the output signal of the one-shot pulse generator circuit 22b, a set/reset flip-flop 22d which is set in response to rise of an output signal of the AND circuit 22c and reset in response to rise of the output signal of the one-shot pulse generator circuit 22a, and an invertor 22e for inverting the dummy cycle detection signal ZPOR8 outputted from the set/reset flip-flop 22d for supplying to the one-shot pulse generator circuit 22b.

The one-shot pulse generator circuit 22a includes three-stage cascaded invertors 22aa, 22ab and 22ac receiving the power-on detection signal ZPOR, and an AND circuit 22ad receiving the power-on detection signal ZPOR and an output signal of the invertor 22ac. An output signal of the AND circuit 22ad is supplied to a reset input R of the set/reset flip-flop 22d.

The one-shot pulse generator circuit 22b includes a NAND circuit 22ba receiving the row address strobe signal /RAS and an output signal of the invertor 22e, an invertor 22bb receiving an output signal of the NAND circuit 22ba, an invertor 22bc receiving an output signal of the invertor 22bb, and a NOR circuit 22bd receiving the row address strobe signal /RAS and an output signal of the invertor 22bc. An output signal of the NOR circuit 22bd is supplied to one input of the AND circuit 22c. The operation is now briefly described.

In the one-shot pulse generator circuit 22a, the output signal of the invertor 22ac is still at a high level when the power-on detection signal ZPOR rises to a high level, and hence the output signal of the AND circuit 22ad goes high. After a lapse of delay times provided by the invertors 22aa to 22ac, the output signals of the invertor 22ac and the AND circuit 22ad go low. The set/reset flip-flop 22d is reset to reliably initialize the dummy cycle detection signal ZPOR8 in an inactive state of a low level.

When the power-on detection signal ZPOR rises to a high level, the AND circuit 22c is enabled to pass the output signal of the one-shot pulse generator circuit 22b. When the row address strobe signal /RAS is at a high level, the output signal of the NOR circuit 22bd is at a low level. When the row address strobe signal /RAS is at a low level, on the other hand, the output signal of the NAND circuit 22ba is at a high level, and the output signal of the NOR circuit 22bd goes low in response. Regardless of whether the row address strobe signal /RAS is set at a high level or a low level in a power-on, therefore, the output signal of the AND circuit 22c is at a low level and the set/reset flip-flop 22d maintains a reset state.

When the row address strobe signal /RAS falls from a high level to a low level, the output signal of the NOR circuit 22bd goes high since the output signal of the invertor 22bc is currently at a low level, and the output signal of the AND circuit 22c goes high in response, the set/reset flip-flop 22d is set, and the dummy cycle detection signal ZPOR8 enters an active state of a high level. After a lapse of delay times provided by the NAND circuit 22ba and the invertors 22bb and 22bc, the output signals of the invertor 22bc and the NOR circuit 22bd go high and low, respectively. When the dummy cycle detection signal ZPOR8 rises to a high level, on the other hand, the output signal of the invertor 22e goes low and the output signal of the NAND circuit 22ba of the one-shot pulse generator circuit 22b is fixed at a high level. Thus, the one-shot pulse generator circuit 22b is inactivated after the dummy cycle detection signal ZPOR8 is activated. Even if the row address strobe signal /RAS is changed from a high level to a low level in a following dummy cycle or a normal operation cycle, the output signal of the one-shot pulse generator circuit 22b maintains a low level. Thus, the pulse generation of the one-shot pulse generator circuit 22b is stopped after the dummy cycle, to reduce the current consumption.

Figure 6:
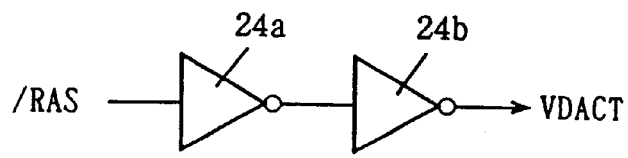
FIG. 6 illustrates an exemplary structure of an active control signal generator circuit shown in FIG. 1.

FIG. 6 illustrates an exemplary structure of the active control signal generator circuit 24 shown in FIG. 1. Referring to FIG. 6, the active control signal generator circuit 24 includes an invertor 24a receiving the external row address strobe signal /RAS, and an invertor 24b receiving an output signal of the invertor 24a and outputting the active control signal VDACT. The active control signal generator circuit 24 shown in FIG. 6 is substantively a RAS buffer for buffering the externally supplied row address strobe signal /RAS and producing an internal row address strobe signal.

When the active control signal VDACT is employed as the internal row address strobe signal and supplied to other RAS related circuits, i.e., circuits operating in accordance with the row address strobe signal /RAS, therefore, these RAS related circuits can be reliably set in standby states upon a power-on for preventing flow of a large operating current due to active states of the RAS related circuits immediately after the power-on. Such RAS related circuits include a row address buffer incorporating an external row address signal and forming an internal row address signal, a decoder/word driver for driving a word line to a selected state, a sense amplifier circuit for sensing and amplifying data of a selected memory cell, and a bit line precharge circuit for precharging each bit line pair to a prescribed potential.

According to the embodiment 1 of the present invention, as hereinabove described, the voltage down-converting activation signal is maintained in an inactive state until a dummy cycle is performed immediately after a power-on, whereby current consumption can be reliably suppressed in the internal voltage down-converting circuit immediately after the power-on.

[Embodiment 2]

Figure 7:
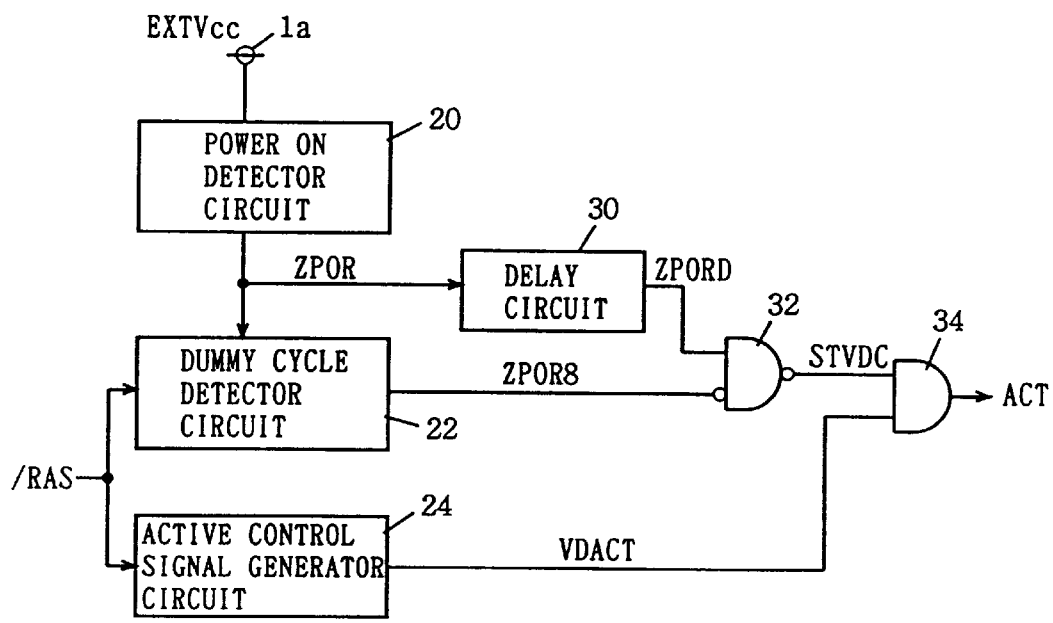
FIG. 7 schematically illustrates the structure of a principal part of a semiconductor memory device according to an embodiment 2 of the present invention.

FIG. 7 illustrates the structure of a principal part of a semiconductor memory device according to an embodiment 2 of the present invention. FIG. 7 only shows the structure of a part generating a voltage down-converting activation signal ACT for activating/inactivating an active voltage down-converting circuit. Referring to FIG. 7, the voltage down-converting activation signal generator part includes a power-on detector circuit 20 for outputting a power-on detection signal ZPOR in accordance with application of an external power supply voltage EXTVcc on an external power supply node (terminal) 1a, a dummy cycle detector circuit 22 which is reset and enabled in accordance with the power-on detection signal ZPOR for detecting instruction of a dummy cycle in accordance with an external row address strobe signal /RAS, and an active control signal generator circuit 24 outputting an active control signal VDACT for activating the active voltage down-converting circuit in accordance with the external row address strobe signal /RAS. The power-on detector circuit 20, the dummy cycle detector circuit 22 and the active control signal generator circuit 24 are identical in structure to those according to the embodiment 1.

The voltage down-converting activation signal generator part further includes a delay circuit 30 for delaying the power-on detection signal ZPOR for a prescribed time, a gate circuit 32 receiving a delayed power-on detection signal ZPORD outputted from the delay circuit 30 and a dummy cycle detection signal ZPOR8 from the dummy cycle detector circuit 22, and an AND circuit 34 receiving a voltage down-converting operation stop instruction signal STVDC outputted from the gate circuit 32 and the active control signal VDACT from the active control signal generator circuit 24. The AND circuit 34 outputs the voltage down-converting activation signal ACT for activating the active voltage down-converting circuit (see FIG. 1).

The gate circuit 32 sets the voltage down-converting operation stop instruction signal STVDC only when the delayed power-on detection signal ZPORD outputted from the delay circuit 30 is at a high level and the dummy cycle detection signal ZPOR8 from the dummy cycle detector circuit 22 is at a low level. The operations of the voltage down-converting activation signal generator part shown in FIG. 7 are now described with reference to waveform diagrams shown in FIGS. 8 and 9.

Figure 8:
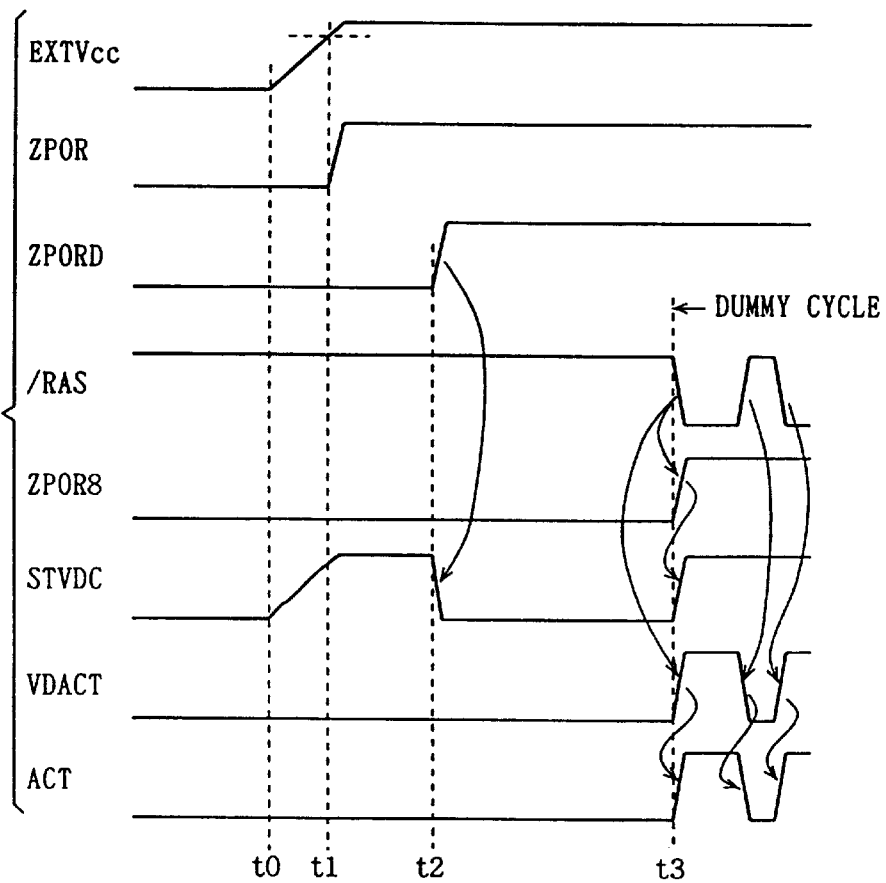
FIG. 8 is a signal waveform diagram representing an operation of the circuit shown in FIG. 7.

With reference to FIG. 8, description is made on an operation in case of making power on while setting the row address strobe signal /RAS at a high level.

At a time t0, power is on while setting the row address strobe signal /RAS at a high level, to increase the voltage level of the external power supply voltage EXTVcc. While the potential of an internal node is increased in accordance with the application of the external power supply voltage EXTVcc, the output signal ZPOR of the power-on detector circuit 20 and the dummy cycle detection signal ZPOR8 outputted from the dummy cycle detector circuit 22 are at low levels, and the voltage level of the signal STVDC outputted from the gate circuit 32 is increased in accordance with increase of an internal power supply voltage INTVcc or the external power supply voltage EXTVcc.

At a time t1, the external power supply voltage EXTVcc reaches a prescribed voltage level or enters a stable state, whereby the power-on detection signal ZPOR from the power-on detection signal 20 rises to a high level. At this time, the delayed power-on detection signal ZPORD outputted from the delay circuit 30 is still at a low level, and the signal STVDC is at a high level. The active control signal generator circuit 24 outputs an active control signal VDACT at a low level, since the row address strobe signal /RAS is at a high level. Therefore, the voltage down-converting activation signal ACT is still at a low level.

After a lapse of a delay time provided by the delay circuit 30, the delayed power-on detection signal ZPORD rises to a high level. At this time, the dummy cycle detection signal ZPOR8 from the dummy cycle detector circuit 22 is at a low level if no dummy cycle is yet performed. When the delayed power-on detection signal ZPORD rises to a high level at a time t2, the voltage down-converting operation stop instruction signal STVDC from the gate circuit 32 falls to a low level, and the AND circuit 34 is disabled to maintain the voltage down-converting activation signal ACT in an inactive state.

When the row address strobe signal /RAS falls to a low level to carry out the dummy cycle, the dummy cycle detection signal ZPOR8 rises to a high level, the voltage down-converting operation stop instruction signal STVCD rises to a high level in response, and the voltage down-converting activation signal ACT is changed in accordance with the active control signal VDACT from the active control signal generator circuit 24. When an internal circuit operates in execution of the dummy cycle, the active voltage down-converting circuit is activated to compensate for reduction of the internal power supply voltage INTVcc caused by a large operating current, whereby internal signal lines and the internal node can be reliably set at prescribed potential levels.

With reference to FIG. 9, description is now made on an operation in case of making power on while setting the row address strobe signal /RAS at a low level.

At a time t0, power is on while setting the row address strobe signal /RAS at a low level, to increase the voltage level of the external power supply voltage EXTVcc. The signal ZPORD outputted from the delay circuit 30 is at a low level in this state, whereby the voltage level of the signal STVDC from the gate circuit 32 is increased in response to the increase of the voltage level of the external power supply voltage EXTVcc. The row address strobe signal /RAS is set at the low level, whereby the voltage level of the active control signal VDACT from the active control signal generator circuit 24 is also increased in response to the external power supply voltage EXTVcc.

At a time t1, the external power supply voltage EXTVcc reaches a prescribed voltage level or a stable state, whereby the power-on detection signal ZPOR from the power-on detector circuit 20 rises to a high level, and the dummy cycle detector circuit 22 is reset and activated. When both of the signals STVDC and VDACT go high beyond prescribed potentials, the voltage down-converting activation signal ACT from the AND circuit 34 goes high. FIG. 9 shows the voltage down-converting activation signal ACT rising to a high level in accordance with the activation of the power-on detection signal ZPOR. In order to activate the voltage down-converting activation signal ACT in response to the rise of the power-on detection signal ZPOR, the power-on detection signal ZPOR may simply be additionally supplied to the AND circuit 34. Thus, the active voltage down-converting circuit can be reliably activated in stabilization of the external power supply voltage EXTVcc. The voltage level of the active control signal ACT may be increased from immediately after the power-on at the time t0, as shown by a chain line.

In accordance with the activation of the voltage down-converting activation signal ACT at the time t1, the active voltage down-converting circuit (see FIG. 1) is activated to supply a current to an internal power supply line for reliably driving the internal power supply voltage INTVcc to a stable state or setting the same at a prescribed voltage level at a high speed.

After a lapse of the delay time provided by the delay circuit 30, the delayed power-on detection signal ZPORD rises to a high level, the voltage down-converting operation stop instruction signal STVDC from the gate circuit 32 goes low, and the voltage down-converting activation signal ACT is also driven to a low level in response. Thus, the active voltage down-converting circuit enters an inactive state, to stop current consumption.

Before carrying out the dummy cycle, the row address strobe signal /RAS is driven to a high level, and the active control signal VDACT goes low in response.

At a time t3, the row address strobe signal /RAS falls from the high level to a low level to start the dummy cycle, whereby the dummy cycle detection signal ZPOR8 from the dummy cycle detector circuit 22 rises to a high level, and the voltage down-converting operation stop instruction signal STVDC goes high in response, to enable the AND circuit 34. Thus, the active control signal VDACT is generated in accordance with the row address strobe signal /RAS during the dummy cycle period, so that the voltage down-converting activation signal ACT is activated/inactivated in synchronization with the active control signal VDACT.

In case of making power on while setting the row address strobe signal /RAS at a low level as shown in FIG. 9, the voltage down-converting activation signal ACT is activated between the times t1 and t2, and the active voltage down-converting circuit operates to consume the current. When the delayed power-on detection signal ZPORD from the delay circuit 30 goes high, however, the voltage down-converting activation signal ACT and the active voltage down-converting circuit are in inactive states until the dummy cycle is carried out. Between the times t2 and t3, therefore, the active voltage down-converting circuit consumes no current, and the current consumption can be reduced as compared with the prior art. Further, the internal power supply voltage INTVcc can be reliably driven to a stable state by activating the active voltage down-converting circuit immediately after the power-on by the delayed power-on detection signal ZPORD through the delay circuit 30.

The high level of the voltage down-converting activation signal ACT for controlling the active voltage down-converting circuit is at the external power supply voltage EXTVcc level. In order to implement this, the respective parts such as the power-on detector circuit 20, the dummy cycle detector circuit 22 and the active control signal generator circuit 24 may be formed to operate with the external power supply voltage EXTVcc serving as one operating power supply voltage in each of the embodiments 1 and 2. Alternatively, the AND circuit 26a or 34 outputting the voltage down-converting activation signal ACT may be provided with a level converting function for converting a signal of the internal power supply voltage INTVcc level to that of the external power supply voltage EXTVcc level.

When the dummy cycle is carried out before the lapse of the delay time provided by the delay circuit 30 in the structure shown in FIG. 7, the voltage down-converting operation stop instruction signal STVDC outputted from the gate circuit 32 goes high in accordance with activation of the dummy cycle detection signal ZPOR8. In this case, therefore, the active voltage down-converting circuit can be driven in the dummy cycle.

According to the embodiment 2 of the present invention, as hereinabove described, the voltage down-converting circuit is rendered operable during the delay time through the delay circuit after the power-on if no dummy cycle is carried out. When the power is on with the row address strobe signal /RAS at a low level, the active voltage down-converting circuit can be driven during this time period to stabilize the internal power supply voltage INTVcc. The voltage down-converting activation signal ACT is inactivated in the period before the dummy cycle whether the row address strobe signal /RAS is set at a high level or a low level after the power supply, whereby the current consumption can be reduced in the active voltage down-converting circuit.

In the aforementioned description, the active control signal VDACT for driving the active voltage down-converting circuit is outputted in accordance with the row address strobe signal /RAS. However, the row address strobe signal /RAS can be replaced with any signal, so far as the signal defines the memory cycle (a signal defining standby and active cycles).

According to the present invention, as hereinabove described, the voltage down-converting activation signal for controlling activation/inactivation of the internal voltage down-converting circuit is maintained in an inactive state until a dummy cycle is carried out after a power-on, whereby current consumption can be reduced in the internal voltage down-converting circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    an internal voltage down-converting circuit activated in response to activation of a voltage down-converting activation signal for down-converting an external power supply voltage to produce an internal power supply voltage;
    a power-on detector circuit for generating a power-on detection signal entering an active state in response to a start of application of said external power supply voltage; and
    control means for forcibly maintaining said voltage down-converting activation signal in an inactive state in response to activation of said power-on detection signal.

2. The semiconductor memory device in accordance with claim 1, further comprising delay means for delaying said power-on detection signal by a prescribed time for supplying to said control means,
    said control means including means for stopping maintenance of said voltage down-converting activation signal in said inactive state in response to an inactive state of an output signal from said delay means.

3. A semiconductor memory device comprising:
    an internal voltage down-converting circuit activated in response to activation of a voltage down-converting activation signal for down-converting an external power supply voltage to produce an internal power supply voltage;
    a power-on detector circuit for generating a power-on detection signal entering an active state in response to a start of application of said external power supply voltage; and
    control means for maintaining said voltage down-converting activation signal in an inactive state in response to activation of said power-on detection signal, wherein said control means comprises:
        dummy cycle detector means for detecting instruction of a dummy cycle for resetting an internal circuit into an initial state in response to an operation cycle instruction signal, and
        stop means for stopping an operation of maintaining said voltage down-converting activation signal in said inactive state in response to activation of a dummy cycle detection instruction signal from said dummy cycle detector means.

4. The semiconductor memory device in accordance with claim 3, wherein said control means further comprises active control signal generator means for generating an active control signal for activating said internal voltage down-converting circuit in accordance with said operation cycle instruction signal, the stop means included in said control means including a gate circuit for generating said voltage down-converting activation signal in accordance with said active control signal in response to activation of said dummy cycle detection instruction signal.

5. A semiconductor memory device comprising:

an internal voltage down-converting circuit activated in response to activation of a voltage down-converting activation signal for down-converting an external power supply voltage to produce an internal power supply voltage;

internal operation activation signal generator means for generating an internal operation activation signal for activating said voltage down-converting activation signal in response to an external operation cycle defining signal;

a power-on detector circuit for generating a power-on detection signal entering an active state in response to start of application of said external power supply voltage;

dummy cycle detector means for detecting an instruction of a dummy cycle for resetting an internal circuit into an initial state in response to said power-on detection signal and said operation cycle defining signal and generating a dummy cycle detection signal activated in the detection of the dummy cycle instruction; and control means for receiving said dummy cycle detection signal to stop generation of said voltage down-converting activation signal in accordance with said internal operation activation signal and to maintain said voltage down-converting activation signal in an inactive state until activation of said dummy cycle detection signal.

6. The semiconductor memory device in accordance with claim 5, further comprising a delay circuit for delaying said power-on detection signal by a prescribed time for supplying to said control means.

7. The semiconductor memory device in accordance with claim 6, wherein said control means includes means for carrying out operations of stopping generation of said voltage down-converting activation signal in accordance with said internal operation activation signal and for maintaining said voltage down-converting activation signal in an said inactive state in response to an active state of an output signal from said delay circuit and an inactive state of said dummy cycle detection signal.

* * * * *